United States Patent
Kawashima et al.

(10) Patent No.: US 8,659,020 B2
(45) Date of Patent: Feb. 25, 2014

(54) EPITAXIAL SILICON WAFER AND METHOD FOR MANUFACTURING SAME

(75) Inventors: Tadashi Kawashima, Tokyo (JP); Masahiro Yoshikawa, Tokyo (JP); Akira Inoue, Tokyo (JP); Yoshiya Yoshida, Tokyo (JP)

(73) Assignee: Sumco Corporation, Tokyo (JP)

( * ) Notice: Subject to any disclaimer, the term of this patent is extended or adjusted under 35 U.S.C. 154(b) by 55 days.

(21) Appl. No.: 13/378,562

(22) PCT Filed: May 28, 2010

(86) PCT No.: PCT/JP2010/059089
§ 371 (c)(1),
(2), (4) Date: Dec. 15, 2011

(87) PCT Pub. No.: WO2011/001770
PCT Pub. Date: Jan. 6, 2011

(65) Prior Publication Data
US 2012/0112190 A1  May 10, 2012

(30) Foreign Application Priority Data

Jun. 29, 2009 (JP) ................ 2009-153496

(51) Int. Cl.
*H01L 29/04* (2006.01)
*H01L 21/336* (2006.01)

(52) U.S. Cl.
USPC ............ 257/50; 257/51; 257/190; 257/192; 257/288; 257/408; 438/270; 438/286; 438/527; 438/791

(58) Field of Classification Search
USPC ............ 257/50, 51, 192, 190, 288, 408; 438/270, 286, 527, 791
See application file for complete search history.

(56) References Cited

U.S. PATENT DOCUMENTS 5,553,566 A   9/1996 Chiou et al.
5,744,396 A   4/1998 Chiou et al.
2011/0049438 A1   3/2011 Kawazone et al.

FOREIGN PATENT DOCUMENTS

| EP | 1 143 047 A1 | 10/2001 |
| JP | 9-007961 A | 1/1997 |
| JP | 10-172976 A | 6/1998 |
| JP | 10-223641 A | 8/1998 |
| JP | 2000-31153 A | 1/2000 |
| JP | 2001-167995 A | 6/2001 |
| JP | 2003-188107 A | 7/2003 |
| WO | 2008/146725 A1 | 12/2008 |

OTHER PUBLICATIONS

International Search Report for PCT/JP2010/059089, Dated: Jun. 29, 2010.
"Gettering Processing Technique", Science in Silicon Surface Science Technology Series No. 3, UCS Semiconductor Infrastructure Technology Research Association, 1996, pp. 586-587.
U.S. Appl. No. 13/382,674 to Tadashi Kawashima et al., which was filed Jan. 6, 2012.

*Primary Examiner* — Steven Loke
*Assistant Examiner* — Junaiden Mirsalahuddin
(74) *Attorney, Agent, or Firm* — Greenblum & Bernstein, P.L.C.

(57) ABSTRACT

It is an object to provide an epitaxial silicon wafer that is provided with an excellent gettering ability in which a polysilicon layer is formed on the rear face side of a silicon crystal substrate into which phosphorus (P) and germanium (Ge) have been doped. A silicon epitaxial layer is grown by a CVD method on the surface of a silicon crystal substrate into which phosphorus and germanium have been doped at a high concentration. After that, a PBS forming step for growing a polysilicon layer is executed on the rear face side of a silicon crystal substrate. By the above steps, the number of LPDs (caused by an SF) that occur on the surface of the epitaxial silicon wafer due to the SF can be greatly reduced.

12 Claims, 4 Drawing Sheets

EPITAXIAL SILICON WAFER AND METHOD FOR MANUFACTURING SAME

TECHNICAL FIELD

The present invention relates to an epitaxial silicon wafer that is used for a semiconductor circuit and a method for manufacturing the epitaxial silicon wafer. More specifically, the present invention relates to an epitaxial silicon wafer in which a polysilicon layer is formed on the rear face side of a silicon crystal substrate into which phosphorus has been doped as an n-type dopant for adjusting an electric resistivity and germanium has been doped and a silicon epitaxial layer is formed on the surface of the silicon crystal substrate and to a method for manufacturing the epitaxial silicon wafer.

BACKGROUND ART

For instance, an electric resistivity of a silicon crystal substrate must be extremely low in the case of an epitaxial silicon wafer for a power MOS transistor. In order to reduce an electric resistivity of a silicon crystal substrate to a satisfactory extent, arsenic (As) and antimony (Sb) are doped as an n-type dopant for adjusting a resistivity into molten silicon in a pulling step of a silicon crystal ingot that is a raw material of a wafer (that is, in growing a silicon crystal). The above technique is publicly known. However, since the above dopant is extremely easily vaporized, it is difficult to fully increase a dopant concentration in a silicon crystal, whereby it is difficult to manufacture a silicon crystal substrate that is provided with a low resistivity that is a required degree.

Consequently, a silicon crystal substrate into which phosphorus (P) has been doped at a high concentration as an n-type dopant that is provided with a characteristic of a low volatility and in which an electric resistivity is extremely low is being used.

However, in the case in which a silicon epitaxial layer is formed on a silicon crystal substrate into which phosphorus has been doped at a high concentration, a dislocation defect (a misfit dislocation) caused by a difference of a concentration of phosphorus at an interfacial part between a silicon crystal substrate and a silicon epitaxial layer occurs unfortunately. A misfit dislocation is propagated from an interfacial part of a silicon crystal substrate to a surface of a silicon epitaxial layer and is visually observed as a congestion of long and thin lines. The misfit dislocation results in a decrease in an electrical performance of a semiconductor device. A cause of the misfit dislocation is that an atomic radius of phosphorus is 1.10 A (angstrom) that is extremely smaller than an atomic radius of silicon which is 1.17 A, and a great difference of a covalent radius of the both sides causes an unnecessary strain in a crystal. (Since an atomic radius of arsenic is 1.18 A that is fairly close to an atomic radius of silicon, a misfit dislocation less occurs.)

In order to solve the above problem, germanium (Ge) of which an atomic radius is 1.22 A that is larger than that of silicon is doped simultaneously with phosphorus in a pulling step of a silicon single crystal ingot. By this process, a strain of a silicon crystal lattice caused by phosphorus is relaxed by germanium and an occurrence of a misfit dislocation is suppressed (see Patent Literature 1).

An epitaxial growth occurs at a high temperature for an epitaxial wafer. Consequently, an oxygen precipitate (BMD) and an oxygen precipitation nucleus that have been formed in a crystal in a growing stage of a silicon single crystal ingot are extinguished by a high-temperature heat treatment, whereby a gettering ability is lower unfortunately.

As a gettering method as a countermeasure for resolving a gettering shortage, an IG (intrinsic gettering) method and an EG (extrinsic gettering) method are publicly known (see Non Patent Literature 1).

For instance, a technique for executing an oxygen precipitation nucleus formation heat treatment to a wafer to increase an oxygen precipitation nucleus density and for executing an epitaxial growth is publicly known (see Patent Literature 2).

Moreover, a technique for executing a poly back seal (PBS) method before an epitaxial growth treatment is publicly known (see Patent Literature 3 and Patent Literature 4). The poly back seal (PBS) method is an example of the EG method in which a polysilicon layer is formed on the rear face of a wafer and a strain field and a lattice mismatch that occur at an interface with a substrate are utilized.

CITATION LIST

Patent Literature

[PTL 1]
Japanese Patent Application Laid-Open Publication No. 9-7961
[PTL 2]
Japanese Patent Application Laid-Open Publication No. 10-223641
[PTL 3]
Japanese Patent Application Laid-Open Publication No. 2000-31153
[PTL 4]
Japanese Patent Application Laid-Open Publication No. 2001-167995

Non Patent Literature

[NPL 1]
UCS Semiconductor Infrastructure Technology Research Association, Science in Silicon, Realize Corporation, Jun. 28, 1996, P586-P587

SUMMARY OF INVENTION

Technical Problem

As shown in Patent Literature 1, in the case in which a silicon epitaxial layer is grown on a silicon crystal substrate into which phosphorus and germanium of a high concentration have been doped in growing a silicon crystal by a CVD (Chemical Vapor Deposition) method, the above misfit dislocation is prevented. However, the present inventors have found that another adverse reaction occurs newly by an experiment. The adverse reaction is that a stacking fault (hereafter referred to as an SF) occurs in a silicon epitaxial layer, the SF appears on a wafer surface as a step, and an LPD (Light Point Defect) level on a wafer surface is degraded. In particular, in the case in which a silicon epitaxial layer is grown after a poly back seal is carried out on a rear face side of a silicon crystal substrate, it is found that an LPD level on a wafer surface is degraded and the total number of LPDs caused by the SF is extremely large. For instance, the total number of LPDs caused by the SF (stacking fault) is several thousand or larger in some cases for an epitaxial silicon wafer having a diameter of 200 mm, whereby the epitaxial silicon wafer is off from practical use in some cases. An occurrence cause of the SF is not cleared as the case now stands. It is a unique problem in the case in which a silicon epitaxial layer is formed on a silicon crystal substrate into which phosphorus and germanium have been doped at a high concentration.

The present invention was made in consideration of the above problems, and an object of the present invention is to suppress both of an occurrence of a misfit dislocation and an occurrence of a stacking fault (SF) for an epitaxial silicon wafer in which a polysilicon layer has been formed on a rear face side of a silicon crystal substrate into which phosphorus (P) has been doped as an n-type dopant for adjusting an electric resistivity and germanium (Ge) has been doped as a base.

Solution of Problem

A method for manufacturing an epitaxial silicon wafer in accordance with a first aspect of the present invention is comprised of a first step of preparing a silicon crystal substrate into which an n-type dopant for adjusting an electric resistivity and germanium have been doped; a second step of forming a silicon epitaxial layer on the surface of the silicon crystal substrate; and a third step of forming a polysilicon layer on the rear face side of the silicon crystal substrate after executing the second step.

The above manufacturing method can suppress an occurrence of a misfit dislocation that is a problem in the case in which a silicon epitaxial layer is formed on a silicon crystal substrate by the silicon crystal substrate into which phosphorus has been doped at a high concentration. In addition, since a polysilicon layer is formed on the rear face side of a silicon crystal substrate after a silicon epitaxial layer is formed, the sufficient getering ability can be obtained. Consequently, in the case in which a silicon epitaxial layer is formed, there is no influence caused by a formation of a polysilicon layer, an occurrence of an SF can be suppressed in an effective manner, and the number of light point defects (LPDs) on the surface of the silicon epitaxial layer (the wafer surface) can be extremely reduced. For instance, a wafer in which the number of LPDs on the surface of the silicon epitaxial layer is equal to or less than 32 per surface area of 100 cm$^2$ (a wafer in which the total number of wafer LPDs is equal to or less than 100 in the case of a wafer having a diameter of 200 mm) can be manufactured.

For the above method for manufacturing an epitaxial silicon wafer, it is preferable that a phosphorus concentration of the silicon crystal substrate that is prepared in the first step is adjusted in a range of $4.7 \times 10^{19}$ to $9.47 \times 10^{19}$ atoms/cm$^3$ and a germanium concentration of the silicon crystal substrate is adjusted in a range of $7.0 \times 10^{19}$ to $1.0 \times 10^{20}$ atoms/cm$^3$. By adjusting a phosphorus concentration and a germanium concentration to be in the above concentration range, an occurrence of a misfit dislocation can be suppressed in an effective manner.

The above method for manufacturing an epitaxial silicon wafer can be further comprised of a fourth step of forming an oxide film on the rear face side of the silicon crystal substrate between the first step and the second step. By the above manufacturing method, an auto doping in forming a silicon epitaxial layer can be reduced in an appropriate manner.

The above method for manufacturing an epitaxial silicon wafer can be further comprised of a fifth step of removing the oxide film on the rear face side of the silicon crystal substrate between the second step and the third step. By the above manufacturing method, a polysilicon layer can be formed on the rear face side of the silicon crystal substrate without an oxide film between the polysilicon layer and the silicon crystal substrate.

For the above method for manufacturing an epitaxial silicon wafer, a silicon epitaxial layer can be formed on the silicon crystal substrate at a temperature in the range of 1000 to 1090° C. in the third step. By the above manufacturing method, an occurrence of an SF can be suppressed in an effective manner and the number of LPDs on the surface of the silicon epitaxial layer can be extremely reduced.

An epitaxial silicon wafer in accordance with a second aspect of the present invention is comprised of a silicon crystal substrate into which phosphorus has been doped as an n-type dopant for adjusting an electric resistivity in a concentration range of $4.7 \times 10^{19}$ to $9.47 \times 10^{19}$ atoms/cm$^3$ and germanium has been doped in a concentration range of $7.0 \times 10^{19}$ to $1.0 \times 10^{20}$ atoms/cm$^3$; a silicon epitaxial layer that is formed on the surface of the silicon crystal substrate; and a polysilicon layer that is formed on the rear face side of the silicon crystal substrate, wherein the number of light point defects on the surface of the silicon epitaxial layer is equal to or less than 32 per surface area of 100 cm$^2$.

An epitaxial silicon wafer in accordance with the present invention cannot be manufactured by a manufacturing method in accordance with a conventional technique, and can be manufactured only by a manufacturing method in accordance with the present invention. In other words, a product of a silicon crystal substrate of an n-type that is provided with an extremely low electric resistivity has not been developed. In recent years, such a product has been required. Consequently, an epitaxial silicon wafer that is provided with a silicon epitaxial layer on a silicon crystal substrate into which phosphorus has been doped at a high concentration in growing a silicon crystal is required in order to reduce an electric resistivity to a satisfactory extent. Because of this, it is necessary that germanium is doped at a high concentration in order to suppress an occurrence of a misfit dislocation. However, in the case in which a silicon epitaxial layer is formed on the silicon crystal substrate into which phosphorus and germanium have been doped at a high concentration, the present inventors found that a stacking fault occurs in an epitaxial layer and an LPD density is increased unfortunately. A technique for solving a problem of a stacking fault for an epitaxial silicon wafer into which phosphorus and germanium have been doped at a high concentration has not been developed. Consequently, an epitaxial silicon wafer in accordance with the present invention has not existed and has been newly invented by the present inventors.

BRIEF DESCRIPTION OF DRAWINGS

FIG. 1 is a view showing a relationship between the existence or non-existence of a PBS forming step in the method for manufacturing an epitaxial silicon wafer and the number of LPDs on a surface of a wafer.

FIG. 2 is a flowchart showing a method for manufacturing an epitaxial silicon wafer in accordance with an embodiment of the present invention.

FIG. 3 is a view showing a relationship between a process temperature of an epitaxial growth step in accordance with an embodiment of the present invention and the number of LPDs on a surface of a wafer.

FIG. 4 is a view showing an appearance of a representative minute pit that has been observed on the surface of a silicon crystal substrate.

DESCRIPTION OF EMBODIMENTS

A method for manufacturing an epitaxial silicon wafer in accordance with the present invention will be described below in detail with reference to the drawings.

For the conventional technique as described above, after a polysilicon layer is formed on the rear face side of a silicon crystal substrate into which phosphorus (P) and germanium (Ge) have been doped in growing a silicon crystal (in particular, phosphorus and germanium have been doped at a high concentration that can implement an extremely low electric resistivity that is required for a power MOS transistor) (after the poly back seal forming treatment (PBS forming treatment) method), a silicon epitaxial layer is grown on the surface of the silicon crystal substrate. In that case, a number of stacking faults (SF) is generated in the silicon epitaxial layer.

The present inventors have found that an SF that is generated after an epitaxial growth is generated from a minute pit (a minute depressed part) as an origin that exists on the wafer surface before an epitaxial growth (after baking) by a close investigation of the manufacturing steps of an epitaxial wafer.

Figure 4:
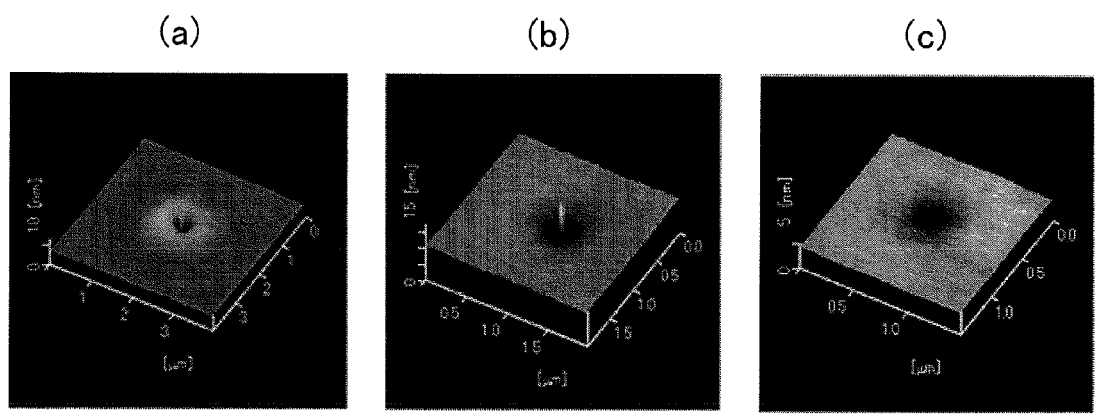
[FIG. 4]

FIG. 4 is a view showing an appearance of a representative minute pit that has been observed on the surface of a silicon crystal substrate in the case in which a polysilicon layer is formed on the rear face side of a silicon crystal substrate into which phosphorus and germanium have been doped at a high concentration, a silicon wafer is pre-baked in a hydrogen atmosphere as a pretreatment of an epitaxial growth, and the surface of the silicon crystal substrate is observed by using an atomic force microscope (AFM).

Even in the case in which a pre-baking treatment is executed to a silicon wafer to which boron (B) has been added as a p-type dopant at a high concentration and germanium has been added, the minute pit is not observed. Consequently, it is thought that phosphorus that has been doped into a crystal of a wafer at a high concentration is more likely to be involved in the minute pit.

For instance, it has been found that red phosphorus has a stimulating effect on a precipitation of oxygen. The poly back seal forming treatment is executed around 650° C. that is a temperature range in which an oxygen precipitation nucleus is formed in a silicon crystal. Consequently, minute oxygen precipitation nuclei are formed in large quantity in a silicon crystal, and a minute pit is more likely to be formed from an oxygen precipitation nucleus as an origin in the case in which a high-temperature heat treatment of a pre-baking treatment is applied. Moreover, a complex of an oxygen precipitate and germanium is formed (clustered), and germanium is sublimed at a comparatively low temperature. Consequently, in the case in which a high-temperature heat treatment of a pre-baking treatment is applied, the complex is sublimed and protruded from the surface of a wafer, and it is thought that the complex part becomes a minute pit. However, it is not yet definite.

The present inventors have found an appropriate execution sequence of a PBS forming step by making an experiment of an influence to an increase in an LPD due to a step for executing a treatment for forming a polysilicon layer (a PBS forming step) in manufacturing an epitaxial silicon wafer in which a polysilicon layer is formed on the rear face side of the silicon crystal substrate and a silicon epitaxial layer is grown on the surface of the silicon crystal substrate to a silicon crystal substrate into which phosphorus and germanium have been doped at a high concentration. In addition, the present inventors have found that there is a most suitable condition of an epitaxial growth step in which an occurrence of a misfit dislocation can be suppressed and an occurrence of an SF can be suppressed as a result of continuing a wide variety of experiments while varying conditions for a step for executing an epitaxial growth (an epitaxial growth step).

Figure 1:
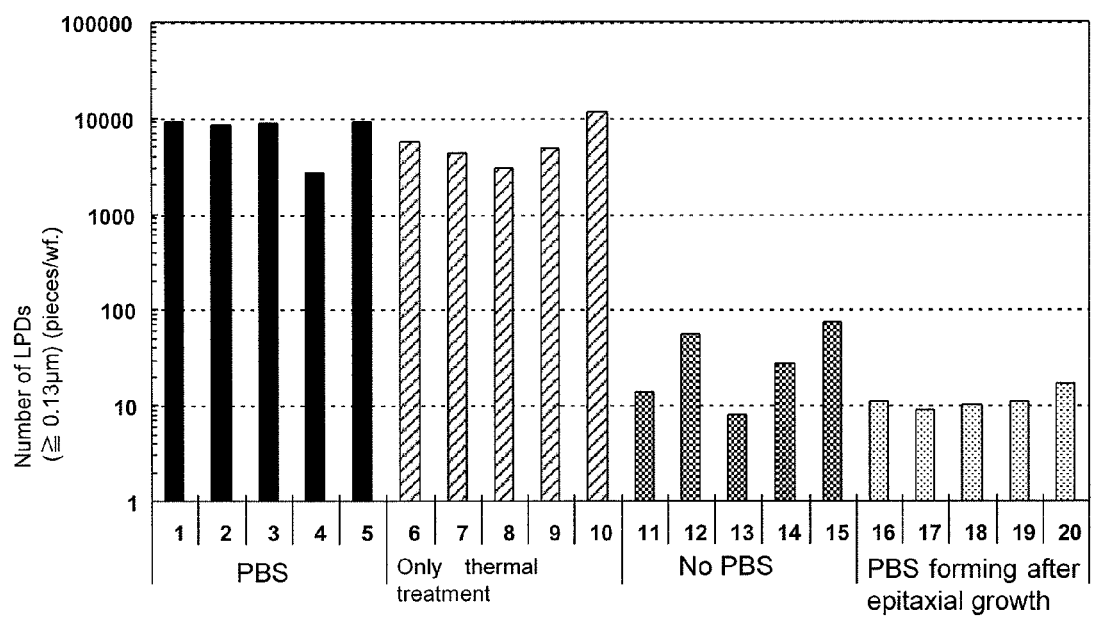
[FIG. 1]

FIG. 1 is a view showing a relationship of the number of LPDs on a surface of a wafer for the case in which a PBS forming step is executed before an epitaxial growth processing, the case in which a PBS forming step is not executed before an epitaxial growth processing, and the case in which a PBS forming step is executed after an epitaxial growth processing in the method for manufacturing an epitaxial silicon wafer. In the figure, a horizontal axis indicates each of wafers in the case in which a PBS forming step is executed before an epitaxial growth processing (a process temperature: 1100° C.) (PBS), in the case in which only a thermal treatment similar to the PBS forming step is executed (only thermal treatment), in the case in which a PBS forming step is not executed, and in the case in which a PBS forming step is executed after an epitaxial growth processing (a process temperature: 1100° C.), and a vertical axis indicates the number of LPDs per wafer.

The number of LPDs per wafer on the surface of the wafer indicated by the vertical axis was measured by a DCN mode of a particle counter SP-1 manufactured by KLA-Tencor Corporation, and indicates the number of LPDs as a result of a detection and a measurement of LPDs of a size of 0.13 μm or larger.

As found from the figure, the number of LPDs that are generated on a wafer can be further reduced in the case in which an epitaxial growth step is executed without executing a PBS forming step before an epitaxial growth processing as compared with the case in which a PBS forming step is executed before an epitaxial growth processing and the case in which a thermal treatment similar to the PBS forming step is executed (the case in which a raw material gas that is a raw material of a polysilicon layer is not supplied under the same temperature condition (for instance, 650° C. for four hours). For instance, the number of LPDs can be reduced to be 100 or less (32 pieces or less per area 100 cm$^2$ on the surface of a wafer (the surface of a silicon epitaxial layer)).

In the present embodiment, each of steps are reviewed in such a manner that a PBS forming step can be executed after an epitaxial growth step in the method for manufacturing an epitaxial silicon wafer.

Figure 2:
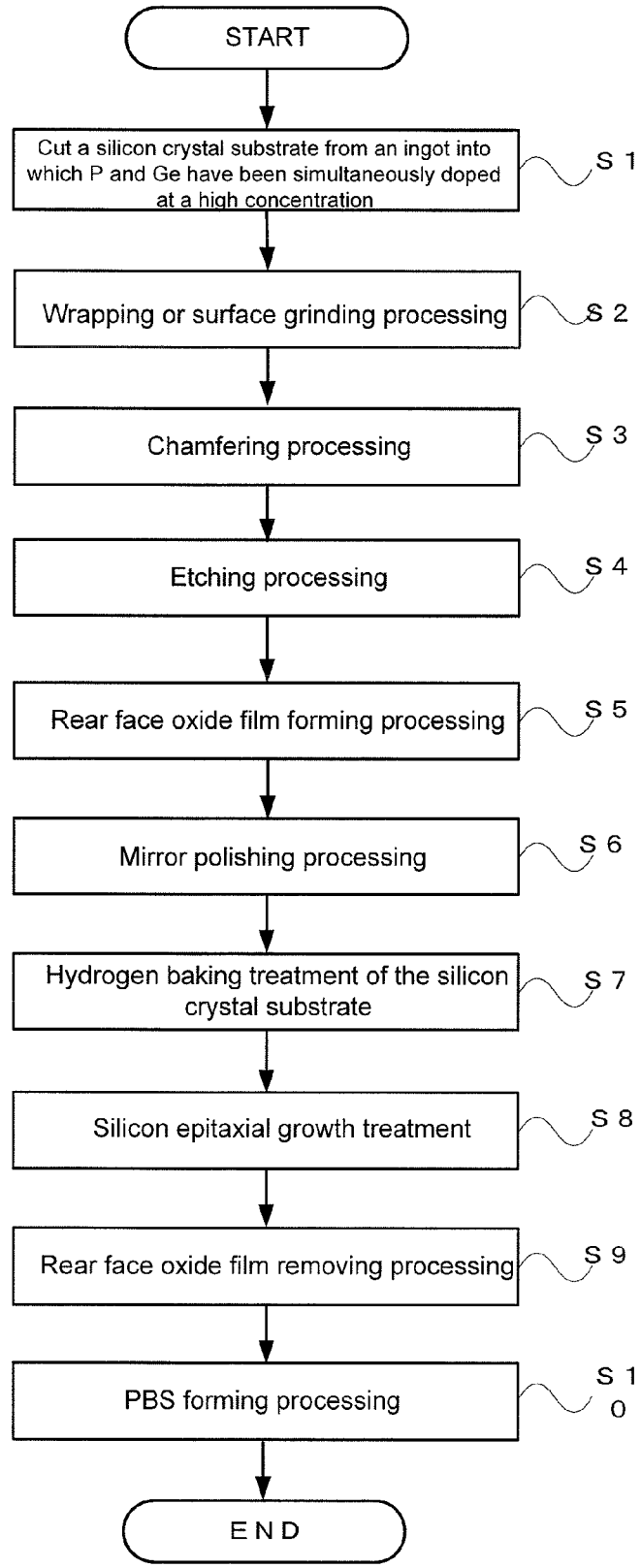
[FIG. 2]

FIG. 2 is a view showing a method for manufacturing an epitaxial silicon wafer in accordance with an embodiment of the present invention.

In the first place, a silicon crystal substrate into which phosphorus and germanium have been doped simultaneously at a high concentration in growing a silicon crystal is prepared (step S1). One of the typical methods is that a silicon single crystal ingot into which phosphorus and germanium have been doped at a high concentration is pulled up by the Czochralski method from a molten silicon into which phosphorus and germanium have been doped at a high concentration and a silicon crystal substrate is fabricated from the silicon single crystal ingot by a heretofore known processing technique (cutting, grinding, polishing, cleaning, and etching).

It is preferable that a phosphorus concentration of the silicon crystal substrate is adjusted in a range of $4.7 \times 10^{19}$ to $9.47 \times 10^{19}$ atoms/cm$^3$ and a germanium concentration of the silicon crystal substrate is adjusted in a range of $7.0 \times 10^{19}$ to $1.0 \times 10^{20}$ atoms/cm$^3$. By adjusting a concentration of phosphorus and germanium in the case in which phosphorus and germanium are doped simultaneously into an original molten silicon from which an ingot is pulled up in a pulling process of a silicon ingot that is a raw material of a silicon crystal substrate, a silicon crystal substrate that contains phosphorus and germanium of a high concentration in the above range can be obtained. An electric resistivity of a silicon crystal substrate into which phosphorus and germanium of a high concentration in the above range have been doped is in the range of $0.8 \times 10^{-3}$ to $1.5 \times 10^{-3}$ Ω·cm. This electric resistivity satisfies a resistivity condition that is required for a wafer for a power MOS transistor.

An effect of germanium that has been doped together with phosphorus can suppress an occurrence of a misfit dislocation in the case in which a silicon epitaxial layer is grown.

In the next place, a silicon crystal substrate is processed to be a constant size by executing a lapping or a surface grinding processing to the silicon crystal substrate that has been cut out (step S2), and a chamfering processing of the silicon crystal substrate is executed (step S3). A mirror polishing can also be executed to a part to which the chamfering processing has been executed (a chamfered part) after the chamfering processing of the silicon crystal substrate, and the step S3 can also be executed before and after the step S2.

In the next place, an etching processing is executed in order to eliminate a damage of a mechanical work of the silicon crystal substrate (step S4), the rear face oxide film forming processing for forming an oxide film on the rear face of the silicon crystal substrate (step S5), and a mirror polishing processing is executed to the surface (one surface or the both surfaces) of the silicon crystal substrate (step S6). The rear face oxide film forming processing is executed for comparatively short time such as 10 minutes at a low temperature in the range of 400 to 500° C. Consequently, the rear face oxide film forming processing has less influence to an occurrence of an LPD in the silicon crystal substrate. By the steps up to 6, a silicon crystal substrate can be obtained in which a mirror polishing processing of the principal surface (a surface on the side on which an epitaxial layer is formed in the present embodiment) is executed, an edge part is chamfered, and an oxide film is formed on the rear face side (a face on an opposite side of the principal surface).

In the next place, before a formation of an epitaxial layer to a silicon crystal substrate, for the purpose of a cleanup of the surface of the silicon crystal substrate (a removal of a natural oxide film and a particle that have adhered to the surface of the silicon crystal substrate), a heat treatment (a pre-baking treatment) is executed at a high temperature for a short time to the silicon crystal substrate (step S7). It is preferable that the pre-baking treatment is executed in an atmosphere of an inert gas such as a hydrogen gas or argon in a temperature range of 1150 to 1200° C. and a pre-baking time is equal to or larger than 35 seconds (for instance, 35 seconds at the shortest).

After the pre-baking treatment, a treatment step for growing a silicon epitaxial layer on the silicon crystal substrate (an epitaxial growth step) is executed by a CVD method (step S8). It is preferable that a process temperature of the epitaxial growth step is in the range of 1000 to 1090° C., more preferably in the range of 1050 to 1080° C. A process temperature of 1000° C. or less is not practicable. Such a range of process temperatures causes a growth speed of a silicon epitaxial layer to be lowered and a quality of a silicon epitaxial layer to be degraded.

In the next place, the rear face oxide film removing processing for removing an oxide film on the rear face of the silicon crystal substrate (step S9), and a PBS forming step for forming a polysilicon layer is executed to the rear face side of the silicon crystal substrate (step S10).

The PBS forming step can be executed by the decompression chemical vapor deposition using a normal vertical reacting furnace for instance. For the PBS forming step, a source gas is $SiH_4$, a pressure is 26.66 pa, and a thickness of a film to be formed is equal to or larger than 0.1 µm for instance. It is preferable that the thickness of a film to be formed is equal to or less than 2 µm from the viewpoint of productivity. A process temperature of the PBS forming step can be 650° C. for instance. In the present embodiment, since an epitaxial layer has already been formed, the PBS forming step hardly affects an occurrence of an LPD in the epitaxial layer unlike an conventional configuration. In the present embodiment, a polysilicon layer is formed on the entire surface of the wafer by the PBS forming step, and a polishing processing and an etching processing are executed to remove the polysilicon layer that has been formed on the surface of the wafer and a chamfered part of the wafer. By the above steps, a wafer is formed in which a polysilicon layer is formed on the rear face of the wafer.

By the above manufacturing process, an epitaxial silicon wafer can be manufactured in which an electric resistivity of a silicon crystal substrate is extremely low in the range of $0.8 \times 10^{-3}$ to $1.5 \times 10^{-3}$ Ω·cm, a misfit dislocation of a silicon epitaxial layer is extremely less, and the number of LPDs caused by a stacking fault (an SF) is less. In the case in which an LPD of a particle size of 0.13 µm or larger is measured in a DCN mode of SP-1 manufactured by KLA-Tencor Corporation, epitaxial silicon wafers of 32 pieces or less per area of 100 $cm^2$ on a wafer surface (a surface of a silicon epitaxial layer) (100 pieces or less on the surface (314 $cm^2$) of a wafer of a diameter of 200 mm), preferably 0 to 3 pieces per area of 100 $cm^2$ on a wafer surface (10 pieces or less on the surface of a wafer of a diameter of 200 mm), which can be used as a power MOS transistor, are manufactured.

An epitaxial silicon wafer in which an electric resistivity of a silicon crystal substrate is extremely low and the number of LPDs caused by a stacking fault (an SF) is extremely less cannot be manufactured by a manufacturing method in accordance with a conventional technique, and can be newly manufactured only by a manufacturing method in accordance with the present invention.

Figure 3:
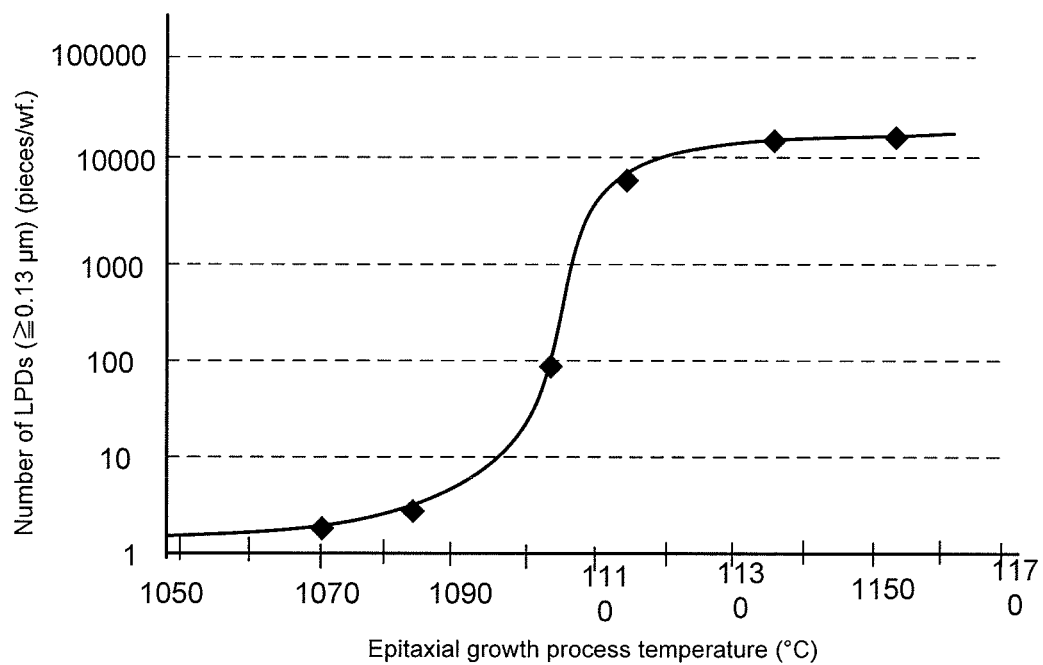
[FIG. 3]

FIG. 3 is a view showing a relationship between a process temperature of an epitaxial growth step in accordance with an embodiment of the present invention and the number of LPDs on a surface of a wafer. FIG. 3 indicates a relationship between a process temperature of an epitaxial growth step and the number of LPDs that appear on a surface of a wafer due to an SF in an experiment in the case in which a process temperature of an epitaxial growth step (an epitaxial growth actual temperature) is varied. In the figure, a horizontal axis indicates a process temperature of an epitaxial growth step and a vertical axis indicates the number of LPDs on a wafer surface per wafer.

The number of LPDs per wafer indicated by the horizontal axis was measured in a DCN mode of SP-1 manufactured by KLA-Tencor Corporation. The shown number of LPDs is a result of a detection and a measurement of LPDs of a size of 0.13 µm or larger.

In the present experiment, a silicon crystal substrate of a diameter of 200 mm into which phosphorus and germanium have been simultaneously doped in the above range of a concentration in growing a silicon crystal was used. The silicon epitaxial layers were formed on 25 silicon crystal substrates for each process temperature. The number of LPDs at each process temperature shown in FIG. 3 is an average value of the number of LPDs of the 25 wafers.

As shown in FIG. 3, the range of process temperatures can be roughly classified into the range of 1110° C. or higher, the range of 1110 to 1090° C., and the range of 1090° C. or less (1000° C. or higher in this regard). In the range of 1110° C. or higher, the number of LPDs is extremely large to be 10000 or larger. In the case in which a process temperature is lowered, the number of LPDs is drastically reduced in the range of 1110 to 1090° C. In the range of 1100 to 1090° C., the number of LPDs is less to be 100 at the most (32 or less per area of 100 cm² on a wafer surface). Moreover, in the range of 1090° C. or less (1000° C. or higher in this regard), the number of LPDs is less to be 30 at the most (10 or less per area of 100 cm² on a wafer surface). Consequently, it is preferable that a process temperature in the epitaxial growth is 1100° C. or less, more preferably in the range of 1000 to 1090° C. In particular, in the range of 1050 to 1080° C., the number of LPDs is extremely less to be several pieces (2 to 0 per area of 100 cm² on a wafer surface) and the above problems in the case in which a process temperature is equal to or less than 1000° C. are less. Consequently, it is said that the range of 1050 to 1080° C. is the most suitable process temperature range.

While the preferred embodiments in accordance with the present invention have been described above, the range of the present invention is not restricted to the embodiments, and various changes, modifications, and functional additions can be thus made without departing from the scope of the present invention.

The invention claimed is:

1. A method for manufacturing an epitaxial silicon wafer, comprising:
   a first step of preparing a silicon crystal substrate into which phosphorus has been doped as an n-type dopant for adjusting an electric resistivity and germanium has been doped;
   a second step of forming a silicon epitaxial layer on the surface of the silicon crystal substrate; and
   a third step of forming a polysilicon layer on the rear face side of the silicon crystal substrate after executing the second step.

2. A method for manufacturing an epitaxial silicon wafer according to claim 1, wherein a phosphorus concentration of the silicon crystal substrate that is prepared in the first step is adjusted in a range of $4.7 \times 10^{19}$ to $9.47 \times 10^{19}$ atoms/cm³ and a germanium concentration of the silicon crystal substrate is adjusted in a range of $7.0 \times 10^{19}$ to $1.0 \times 10^{20}$ atoms/cm³.

3. A method for manufacturing an epitaxial silicon wafer according to claim 1, further comprising:
   a fourth step of forming an oxide film on the rear face side of the silicon crystal substrate between the first step and the second step.

4. A method for manufacturing an epitaxial silicon wafer according to claim 3, further comprising:
   a fifth step of removing the oxide film on the rear face side of the silicon crystal substrate between the second step and the third step.

5. A method for manufacturing an epitaxial silicon wafer according to claim 1, wherein the silicon epitaxial layer is formed on the silicon crystal substrate at a temperature in the range of 1000 to 1090° C. in the third step.

6. A method for manufacturing an epitaxial silicon wafer according to claim 2, further comprising:
   a fourth step of forming an oxide film on the rear face side of the silicon crystal substrate between the first step and the second step.

7. A method for manufacturing an epitaxial silicon wafer according to claim 6, further comprising:
   a fifth step of removing the oxide film on the rear face side of the silicon crystal substrate between the second step and the third step.

8. A method for manufacturing an epitaxial silicon wafer according to claim 2, wherein the silicon epitaxial layer is formed on the silicon crystal substrate at a temperature in the range of 1000 to 1090° C. in the third step.

9. A method for manufacturing an epitaxial silicon wafer according to claim 3, wherein the silicon epitaxial layer is formed on the silicon crystal substrate at a temperature in the range of 1000 to 1090° C. in the third step.

10. A method for manufacturing an epitaxial silicon wafer according to claim 4, wherein the silicon epitaxial layer is formed on the silicon crystal substrate at a temperature in the range of 1000 to 1090° C. in the third step.

11. A method for manufacturing an epitaxial silicon wafer according to claim 6, wherein the silicon epitaxial layer is formed on the silicon crystal substrate at a temperature in the range of 1000 to 1090° C. in the third step.

12. A method for manufacturing an epitaxial silicon wafer according to claim 7, wherein the silicon epitaxial layer is formed on the silicon crystal substrate at a temperature in the range of 1000 to 1090° C. in the third step.

* * * * *